United States Patent
Murakata

(10) Patent No.: US 8,687,353 B2
(45) Date of Patent: Apr. 1, 2014

(54) ELECTRONIC EQUIPMENT

(75) Inventor: Masato Murakata, Osaka (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 13/041,851

(22) Filed: Mar. 7, 2011

(65) Prior Publication Data

US 2011/0216492 A1  Sep. 8, 2011

(30) Foreign Application Priority Data

Mar. 8, 2010  (JP) ................................. 2010-050860

(51) Int. Cl.
- *G06F 1/16* (2006.01)
- *G02F 1/1333* (2006.01)
- *H01Q 1/24* (2006.01)
- *H04M 1/00* (2006.01)

(52) U.S. Cl.
USPC ............ 361/679.24; 361/679.21; 361/679.26; 361/679.27; 349/58; 343/702; 455/575.7; 455/575.8; 455/562.1

(58) Field of Classification Search
USPC ............. 361/679.01–679.45, 679.55–679.59; 349/58–60; 343/702; 455/575.1–575.8, 455/562.1
See application file for complete search history.

(56) References Cited

U.S. PATENT DOCUMENTS

| | | | |
|---|---|---|---|
| 6,456,499 B1 * | 9/2002 | Nakajima et al. | 361/752 |
| 6,650,532 B2 | 11/2003 | Shin | |
| 6,853,353 B2 | 2/2005 | Wang et al. | |
| 6,972,721 B2 * | 12/2005 | Park | 343/702 |
| 7,142,886 B2 * | 11/2006 | Murayama et al. | 455/556.1 |
| 7,242,353 B2 | 7/2007 | Hung et al. | |
| 7,440,264 B2 * | 10/2008 | Lam et al. | 361/679.27 |
| 7,480,154 B2 * | 1/2009 | Lawrence et al. | 361/826 |
| 8,125,772 B2 | 2/2012 | Kim | |
| 2002/0021250 A1 | 2/2002 | Asano et al. | |
| 2002/0118136 A1 * | 8/2002 | Gushiken | 343/702 |
| 2006/0187374 A1 | 8/2006 | Yeom | |
| 2008/0232058 A1 * | 9/2008 | Horiuchi et al. | 361/683 |
| 2009/0244437 A1 * | 10/2009 | Yamaguchi et al. | 349/60 |
| 2009/0284424 A1 * | 11/2009 | Yoon et al. | 343/702 |

FOREIGN PATENT DOCUMENTS

| | | | | |
|---|---|---|---|---|
| JP | 11330827 A | * | 11/1999 | ............... H01Q 1/24 |
| JP | 2000-223915 | | 8/2000 | |
| JP | 2002-207535 | | 7/2002 | |
| JP | 2008-061057 | | 3/2008 | |
| JP | 2011-259311 | | 12/2011 | |

* cited by examiner

*Primary Examiner* — Jayprakash N Gandhi
*Assistant Examiner* — Nidhi Desai
(74) *Attorney, Agent, or Firm* — Hamre, Schumann, Mueller & Larson, P.C.

(57) ABSTRACT

Electronic equipment is obtained, which is capable of regulating the arrangement position of a connection cable connected to an antenna module and preventing antenna properties from being degraded by a positional shift of the connection cable. The electronic equipment includes a housing, an antenna module placed in an end portion of the housing, and a connection cable connecting the antenna module to another electric circuit, wherein a guide groove accommodating the connection cable and regulating an arrangement position of the connection cable is formed on the housing.

16 Claims, 5 Drawing Sheets

ELECTRONIC EQUIPMENT

BACKGROUND OF THE INVENTION

1. Field of the Invention

The present invention relates to electronic equipment provided with an antenna module for exchanging information wirelessly, and in particular, to electronic equipment in which degradation of antenna properties caused by a connection cable of the antenna module is suppressed.

2. Description of Related Art

In recent years, the improvement of the environment for connecting to the Internet wirelessly, such as an increase in public radio local-area network (LAN) spots, is being carried out, and electronic equipment for exchanging information wirelessly is spreading, having an antenna module incorporating an antenna and an antenna peripheral circuit thereof. Examples of such electronic equipment include notebook computers, personal digital assistants (PDAs), mini-notebook computers whose main purpose is outdoor Internet connection, mobile telephones, and mobile game machines.

In conventional notebook computers, a built-in antenna needs to have a predetermined size, and therefore, an antenna module containing an antenna and a peripheral circuit thereof is placed on a main section side of a notebook computer, i.e., in a housing in which a keyboard, a CPU, etc. are placed (see JP2002-207535A).

In recent years, an antenna module is being miniaturized, which increases the options for its placement, and therefore, an antenna module is coming to be placed in an end portion on a side different from a hinge portion side where a hinge mechanism connecting a main section of a notebook computer to a cover section is provided, in a housing containing a liquid crystal panel to be the cover section with respect to the main section. The end portion on the side different from the hinge portion side is positioned in an upper part of the liquid crystal panel during use of the notebook computer. Therefore, the end portion on the side different from the hinge portion side is unlikely to be influenced by other electronic circuits in the main section since it is positioned far away therefrom. The end portion on the side different from the hinge portion side also is placed physically at the highest position in the notebook computer that is being used. Accordingly, the end portion on the side different from the hinge portion side is suitable for placing an antenna module (see JP 2008-061057A).

As described above, if an antenna module is placed in a housing constituting a cover section of a notebook computer with a liquid crystal panel mounted thereon, it is required to connect the antenna module to an electric circuit for transmitting/receiving a radio signal contained in a main section via a hinge portion in which a hinge mechanism for connecting the housing constituting the cover section to the main section is placed. In this case, it is necessary to place a connection cable from the antenna module placed in the end portion on a side different from a hinge portion side to an end portion on a side where the hinge portion adjacent to the main section is provided, that is, from one end of the housing constituting the cover section to the other end thereof.

Conventionally, in order to lock the connection cable from the antenna module placed in one end portion of the housing constituting the cover section to the hinge portion placed in the other end portion, a method for attaching the connection cable to a side surface or a back surface of a liquid crystal panel module with a pressure-sensitive adhesive tape, a method for hooking the connection cable on a hook-shaped adhesive member formed on the housing, etc. have been used.

However, according to the conventional method for attaching a connection cable, only discrete parts of the connection cable in the longitudinal direction thereof are attached. Therefore, if the cover section is rotated with respect to the main section at a start time of using a notebook computer and an end time thereof, or the notebook computer is subjected to impact from the outside, the connection cable may be twisted or vibrated so that its arrangement position moves. The shift of the arrangement position of the connection cable in the housing influences the transmission/reception state of an antenna to cause noise with respect to a signal to be transmitted/received, which degrades the antenna properties.

SUMMARY OF THE INVENTION

Therefore, with the foregoing in mind, it is an object of the present invention to provide electronic equipment capable of preventing degradation in the antenna properties caused by a positional shift of a connection cable to be connected to an antenna module by regulating the arrangement position of the connection cable in the electronic equipment containing the antenna module.

In order to solve the above-mentioned problem, the electronic equipment according to the present invention includes: a housing; an antenna module placed in an end portion of the housing; and a connection cable connecting the antenna module to another electric circuit, wherein a guide groove accommodating the connection cable and regulating an arrangement position of the connection cable is formed on the housing.

In the electronic equipment according to the present invention, the housing is provided with a guide groove accommodating a connection cable that connects an antenna module to another electric circuit and regulating the arrangement position of the connection cable. Therefore, even when a twisting force or vibration acts on the connection cable, the arrangement position of the connection cable does not change. This can prevent the antenna properties from being degraded due to the change in the arrangement position of the connection cable.

BRIEF DESCRIPTION OF THE DRAWINGS

FIG. 4A illustrates the case of using two lines of rib-shaped protrusions formed on the surface of a housing as side walls of the guide grooves, and FIG. 4B illustrates the case of using a level difference of the back surface of the housing as a side wall of the guide groove.

DETAILED DESCRIPTION OF THE INVENTION

Figure 1:
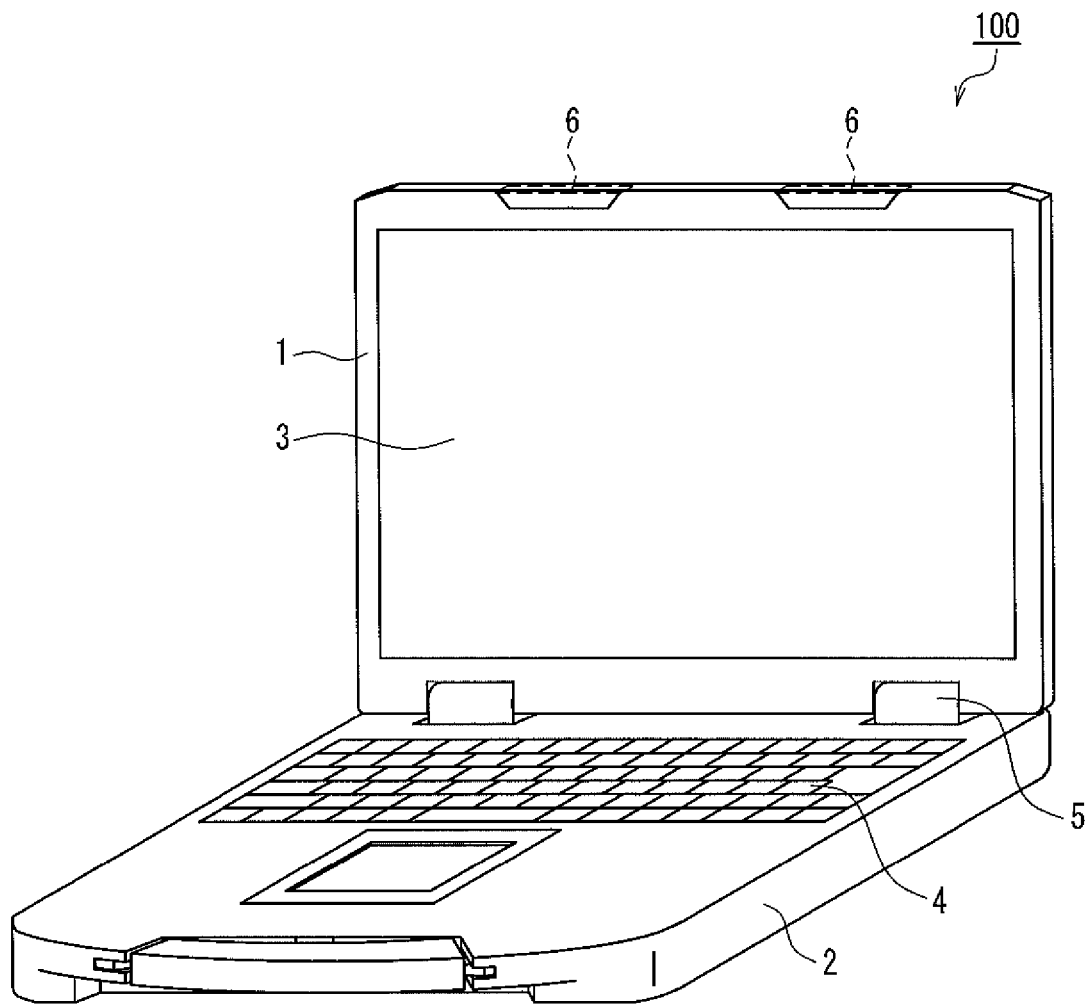
FIG. 1 is a perspective view illustrating an overall configuration of a notebook computer.

The electronic equipment according to the present invention includes: a housing; an antenna module placed in an end portion of the housing; and a connection cable connecting the antenna module to another electric circuit, wherein a guide groove accommodating the connection cable and regulating an arrangement position of the connection cable is formed on the housing.

According to the above-mentioned configuration, in the case where the housing is subjected to vibration from the outside or the case where the electronic equipment has a configuration in which the housing rotates with respect to the main section, even when a twisting force or vibration is applied to the connection cable, the arrangement position of the connection cable can be prevented from being changed. This effectively can prevent the degradation in antenna properties caused by the positional change in connection cable.

In the electronic equipment according to the present invention, it is preferred that the guide groove is formed on a surface of the housing with two lines of rib-shaped protrusions formed in parallel to each other as side walls. According to this configuration, the guide groove regulating the position of the connection cable can be placed at a predetermined position on the housing.

Further, it is preferred that the guide groove has a depth capable of accommodating the connection cable completely. According to this configuration, the connection cable can be accommodated reliably in the guide groove, so that the precise regulation of the position can be performed.

Further, it is preferred that the housing and the guide groove are formed of metal. Since the housing and the guide groove are formed of metal, the guide groove exhibits an effect of shielding the connection cable from noise, which further effectively can avoid the degradation in antenna properties caused by noise.

In this case, it is preferred that at least two connection cables are connected to the antenna module, and the connection cables respectively are accommodated in separate guide grooves. According to this configuration, an effect of shielding the connection cables separately is obtained, which effectively can prevent electric signals transmitted through the connection cables from interfering with each other to generate noise.

Further, it is preferred that the guide groove has a curved part whose arrangement direction on the housing is curved. According to this configuration, an effect of fixing the position of the connection cable in the guide groove by the curved part is obtained, which more reliably can prevent the arrangement position of the connection cable from being changed.

Further, it is preferred that the guide groove is formed with the same depth continuously from the end portion in which the antenna module is placed to an end portion positioned on a side opposite to the end portion in which the antenna module is placed. According to this configuration, the connection cable position can be regulated reliably over the full length, and the operation efficiency of the step of placing the connection cable in the guide groove can be enhanced.

Further, a hinge mechanism is placed in an end portion of the housing positioned on a side opposite to the end portion in which the antenna module is placed, and the housing functions as a cover section formed so as to rotate with respect to a main section connected to the housing via the hinge mechanism. According to this configuration, when the electronic equipment is used with the cover section opened, the antenna module is positioned at a place farthest from the hinge portion, whereby more satisfactory antenna properties can be obtained.

Further, a display element is placed on a surface of the housing opposed to the main section when the cover section is closed, and the guide groove is formed on a surface of the housing on a side opposite to a side where the display element is placed. According to this configuration, the electronic equipment with high reception sensitivity, having a display element on an inner surface of the cover section, can be obtained.

Further, the main section is used as a computer main body equipped with a keyboard, whereby a notebook computer can be obtained in which antenna properties caused by a change in the arrangement position of connection wiring of the antenna module are not degraded.

Hereinafter, a notebook computer will be described as an embodiment of electronic equipment according to the present invention. In the notebook computer of the present embodiment, a housing includes a liquid crystal panel as a display element, and an antenna module is placed in one end portion of the housing. A hinge mechanism is provided in the other end portion of the housing, positioned on a side opposite to the one end portion with the liquid crystal panel interposed therebetween. A cover section is formed so as to be rotated by the hinge mechanism with respect to a computer main body that is a main section.

FIG. 1 is a perspective view illustrating an overall appearance of the notebook computer of the present embodiment.

As illustrated in FIG. 1, a notebook computer 100 of the present embodiment includes a cover section 1 formed by a housing having a liquid crystal panel 3 as a display element, and a computer main body 2 that is a main section having a keyboard 4 on the surface and containing a CPU (not shown), a disk drive (not shown), and the like. The configuration of the computer main body 2 is not particularly different from the configuration of a main section of a conventionally well-known notebook computer, and hence, the description and illustration of the details are omitted.

The notebook computer 100 of the present embodiment is connected so that the cover section 1 can be rotated by two hinge mechanisms formed in the computer main body 2. In each figure after FIG. 1 illustrating the present embodiment, cover parts covering the hinge mechanisms are illustrated as hinge portions 5 instead of illustrating the hinge mechanisms themselves.

FIG. 1 illustrates the state in which the notebook computer 100 is being used with the cover section 1 opened. In the cover section 1 in this state, one end portion is present on a side (hereinafter, referred to as an upper side, an upper part, etc.) opposite to the hinge portions 5 placed in the other end portion, with the liquid crystal panel 3 interposed therebeween. In the end portion on the upper side, antenna modules 6 for performing radio LAN connection are built in on the right and left sides of a surface for viewing the liquid crystal panel 3. That is, the antenna modules 6 are placed in one end portion of the cover section 1, and the hinge portions 5 are placed in the other end portion provided on a side opposite to the one end portion, with the liquid crystal panel 3 interposed therebetween, so as to be connected to the computer main body 2.

In the antenna module 6 of the notebook computer 100 of the present embodiment, an antenna main body and circuit components are mounted on an antenna circuit board. The antenna main body is formed as wiring on the antenna circuit board. The circuit components include a circuit component for adjusting frequency characteristics of the antenna main body and a circuit component such as a filter for removing noise from a received signal, and are mounted on the antenna circuit board. In the notebook computer 100, there is no special constraint for the configuration of the antenna module. More specifically, in the case of the notebook computer 100 as in the present embodiment, a conventionally well-known module can be used appropriately as an antenna module for a radio LAN. In this case, an antenna and a board on which circuit components belonging to the antenna are mounted may be formed as separate members. Further, the use of one circuit board on which the circuit components belonging to the antenna is not an essential requirement in the notebook computer 100, and the antenna module may be composed of at least two circuit boards as in the case where a circuit for finely adjusting antenna properties is formed on a second board.

As illustrated in FIG. 1, in the notebook computer 100 of the present embodiment, the antenna modules 6 are placed separately on the right and left sides in an upper part of the liquid crystal panel 3. This is because two antenna elements constitute a diversity antenna, and the number of the antenna modules in the notebook computer 100 of the present embodiment is not limited to two.

Figure 2:
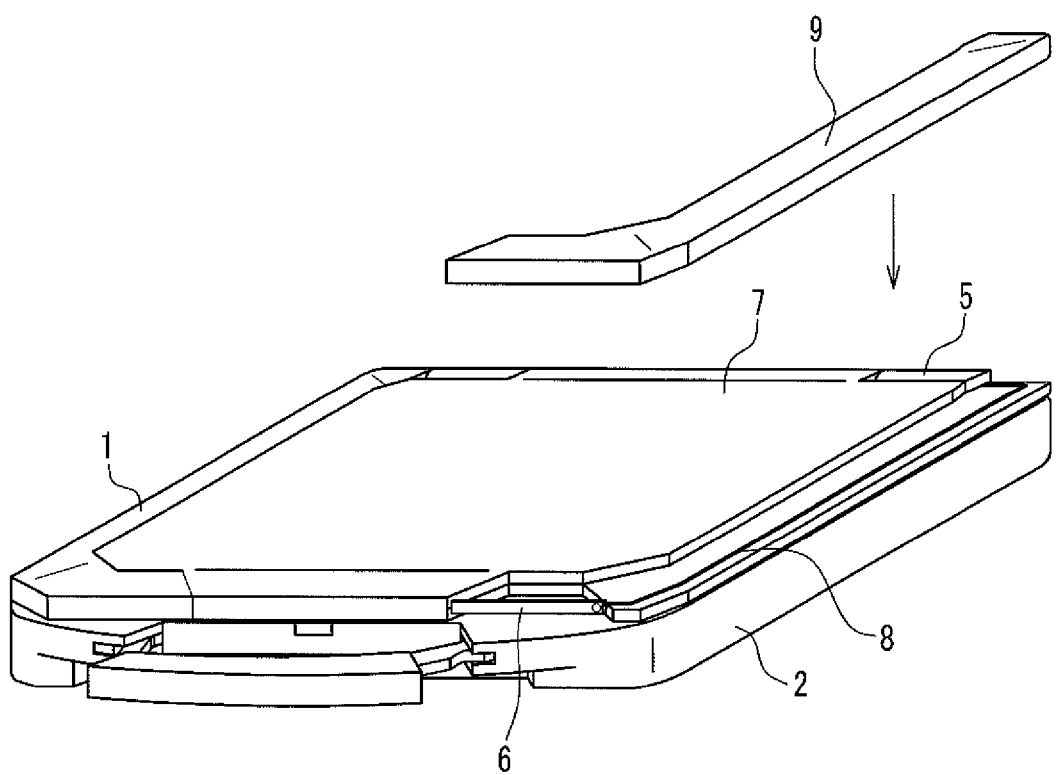
FIG. 2 is an exploded perspective view illustrating a schematic configuration of a cover section of the notebook computer.

FIG. 2 is an exploded perspective view illustrating a configuration of the cover section 1 of the notebook computer 100 of the present embodiment. FIG. 2 illustrates a state in which the cover section 1 of the notebook computer 100 is closed.

As the cover section 1 of the notebook computer 100 of the present embodiment, a housing 7 made of a magnesium alloy is adopted, considering that robustness and light weight should be ensured. Further, a cover 9 is made of resin and extends from the antenna module 6 across the liquid crystal 1 panel 3 to the hinge portion to cover the antenna module 6 and connection cables 8 connected to a LAN circuit board (not shown) in the computer main body 2. In the notebook computer 100 of the present embodiment, in order to protect the liquid crystal panel 3 and/or various circuit boards (not shown), a hard disk drive (not shown), and the like in the computer main body 2 by absorbing shock from the outside, the cover 9 made of resin covers a part of the cover section 1. The cover 9 is made of resin having rubber properties (restoring properties) called thermoplastic elastomer, and in particular, curable elastomer obtained by curing a rubber component, which is based on urethane, butadiene, or the like, having an unsaturated bond is preferred. The material for the cover 9 is not limited to elastomer illustrated above, and various other resins or metal such as a magnesium alloy as in the housing 7 can be used, considering the weight, strength, design, etc. of the cover 9.

For the connection cable 8 used in the notebook computer 100 of the present embodiment, in order to prevent noise from the outside from influencing an electric signal transmitted through the connection cable 8, for example, a coaxial cable is used in which a core wire such as a tin-plated annealed copper wire is covered with an insulating material made of tetrafluoroethylene or FEP resin such as tetrafluoroethylene-.hexafluoropropylene copolymer resin, a shield of a net-shaped tin-plated annealed copper wire is placed on an outer side of the resultant core wire, and the entire core wire is covered with a protective coating made of FEP resin. As resin materials for the insulating material and the protective material, resin other than the FEP resin such as vinyl chloride also can be used. The above-mentioned coaxial cable used as the connection cable 8 is merely an example, and a cable to be used should be selected appropriately considering the characteristics of a signal to be transmitted, the thickness of a cable, a material thereof, and the like. Further, as the connection cable 8, a wiring cable other than a coaxial cable also can be used.

Next, referring to FIG. 3, a detailed arrangement state of the antenna module 6 and the connection cables 8 (8a, 8b) connected to the antenna module 6 in the cover section 1 of the notebook computer 100 of the present embodiment will be described.

Figure 3:
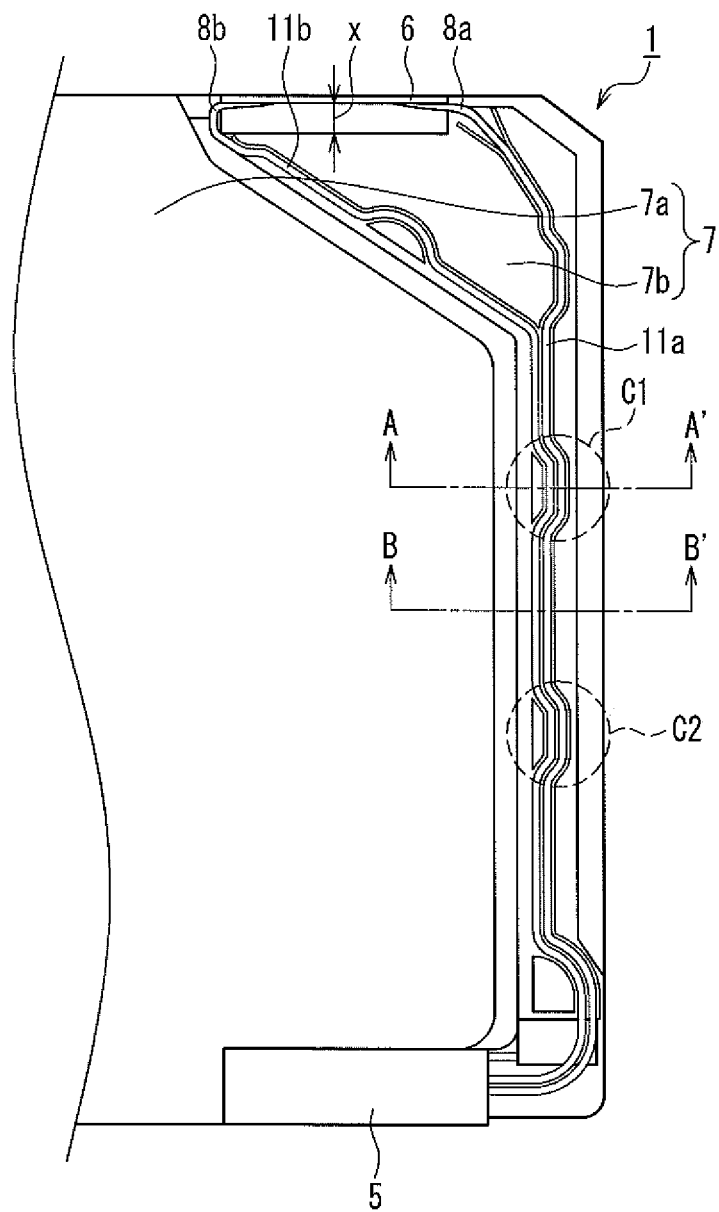
FIG. 3 is a view of the closed cover section of the notebook computer, with a cover removed, seen from an outer side, i.e., a back surface opposite to a viewer surface on which a user views a liquid crystal panel.

FIG. 3 is a view of the closed cover section 1 of the notebook computer 100, with the cover 9 removed, seen from an outer side, i.e., a back surface opposite to a viewer surface on which a user views the liquid crystal panel 3. FIG. 3 also illustrates the antenna module 6 positioned on the right side when the cover section 1 is viewed from the back surface among the two antenna modules 6 and the connection cables 8 thereof. In the case of the notebook computer 100, the respective configurations of the antenna modules 6, the connection cables 8, guide grooves 11a, 11b, etc. placed on the right and left sides on an upper side of the housing 7 have a mirror image relationship. That is, the respective configurations of the antenna modules 6, the connection cables 8, guide grooves 11a, 11b, etc. are placed symmetrical to each other. The configuration of the antenna module 6 is not limited to the one shown in the present embodiment as described above, and the respective antenna modules 6 are allowed to have different configurations when two antenna modules 6 are provided on the right and left of the housing 7.

As illustrated in FIG. 3, in the notebook computer 100, the antenna module 6 is formed as one circuit board and placed in an end portion on an upper side of the housing 7 constituting the cover section 1. In the present embodiment, since the housing 7 of the cover section 1 of the notebook computer 100 is made of metal, when the housing 7 approaches a position close to an antenna of the antenna module 6, the housing 7 that is a metal body having a predetermined capacity or more may influence antenna sensitivity. Therefore, a predetermined gap x is formed between the antenna module 6 and the housing 7.

The connection cables 8a and 8b are connected to both ends of the antenna module 6 on the viewer surface side of the housing 7. The connection cables 8a and 8b respectively extend to a lower end portion with which the hinge portion 5 is engaged in the housing 7 via the vicinity of a side end on the back surface side of the housing 7 (see FIG. 3). Then, the connection cables 8a and 8b are guided to a LAN board (not shown) in the computer main body 2 via a hollow part in the hinge portion 5 engaged with the lower end. The connection cables 8a and 8b are connected to other electric circuits such as a LAN circuit placed on the LAN board (not shown).

The arrangement position of the antenna module 6 and the formation position of the hinge portion 5 on the housing 7 respectively are placed in end portions opposite to each other with the liquid crystal panel 3 interposed therebetween. Therefore, it is necessary for the connection cables 8a, 8b to be placed on the housing 7 over the full length of the housing 7 in the vertical direction of FIG. 3. That is, the connection cables 8a and 8b are required to be placed over a distance between the upper end portion and the lower end portion of the housing 7 placed with the liquid crystal panel 3 interposed therebetween. As illustrated in FIG. 3, the connection cables 8a and 8b are accommodated in the guide grooves 11a and 11b formed in the housing 7 and positioned so as not to move in the distance between the upper end portion and the lower end portion of the housing 7.

Further, in the notebook computer 100, the guide groves 11a and 11b formed on the surface of the housing 7 are provided with two curved parts C1 and C2 curved in a direction perpendicular to the arrangement direction of the guide grooves 11a, 11b on the housing 7, i.e., in the horizontal direction of FIG. 3. Due to the presence of the curved parts C1 and C2, when the connection cables 8a and 8b respectively are accommodated in the guide grooves 11a and 11b, a force is applied to the connection cables 8a and 8b to press them to side walls of the guide grooves 11a and 11b by a predetermined stiffness of the connection cables 8a and 8b. Therefore, the curved parts C1 and C2 can prevent the connection cables 8a and 8b from moving in the arrangement direction of the guide grooves 11a and 11b. Thus, even in the case where a large force is applied to the connection cables 8a and/or 8b from the outside, the arrangement position of the connection cables 8a and 8b on the housing 7 can be prevented from being shifted more effectively.

Further, by providing the curved parts C1 and C2 in the guide grooves 11a and 11b, the connection cables 8a and 8b can be fixed easily while being inserted in the guide grooves 11a and 11b. That is, when the connection cables 8a and 8b are inserted respectively in the guide grooves 11a and 11b having the curved parts C1 and C2, the connection cable 8a or 8b is supplied with a pressure force that presses the connection cable 8a or 8b to the side wall of the guide groove 11a or 11b accommodating the connection cable 8a or 8b. The pressure force can suppress either of the connection cables 8a and 8b from floating up from the guide groove 11a or 11b. Therefore, when the connection cables 8a and 8b are placed respectively in the guide grooves 11a and 11b and covered with the cover 9, it is not necessary to press the floating connection cable 8a and/or 8b with the finger or the like. This enables an operation of placing the cover 9 on the housing 7 to be performed efficiently.

Accordingly, in the notebook computer 100, the guide grooves 11a, 11b are formed, which accommodate the connection cables 8a and 8b connected to the antenna module 6 respectively and independently and regulate the respective arrangement positions on the housing 7. With such a configuration, even when a force changing the positions of the connection cables 8a and 8b is applied thereto, the arrangement positions of the connection cables 8a and 8b can be kept in a desired state. Therefore, the connection cables 8a and 8b effectively can be prevented from changing the arrangement positions thereof to change antenna properties, which generates noise that causes inconvenience such as a decrease in sensitivity of the transmission/reception.

Next, the formation of the guide grooves 11 on the housing 7 will be described with reference to FIG. 4 in addition to FIG. 3.

Figure 4A:
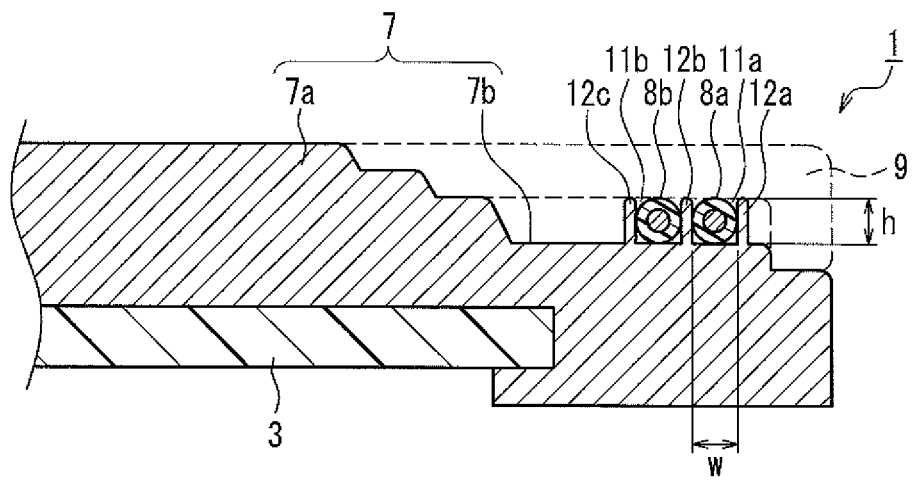
FIGS. 4A and 4B are enlarged cross-sectional views of main portions illustrating a cross-sectional structure of guide grooves formed on the cover section of the notebook computer.
Figure 4B:
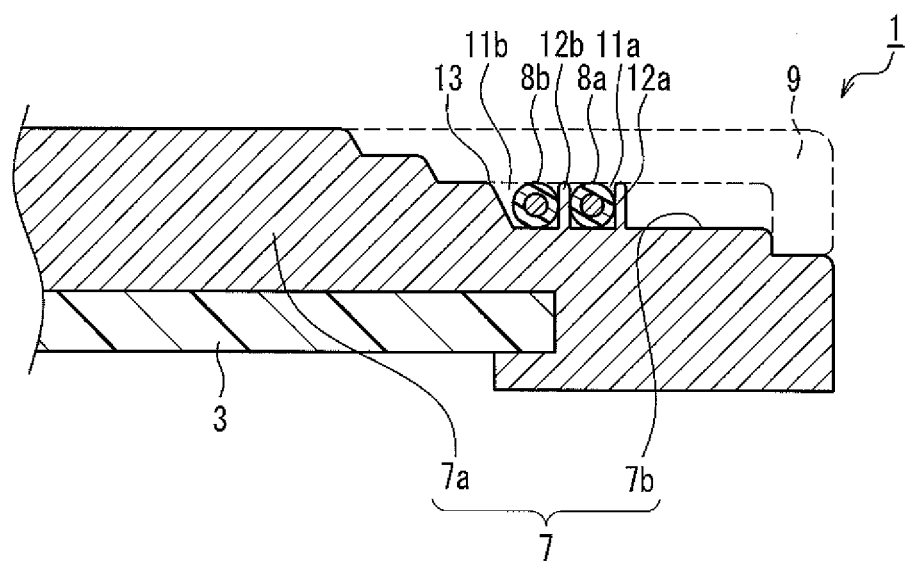

FIGS. 4A and 4B are enlarged cross-sectional views of main portions illustrating the guide grooves 11a and 11b formed on the housing 7 and the states of the connection cables 8a and 8b respectively accommodated in the guide grooves 11a and 11b. FIG. 4A illustrates a cross-sectional configuration taken along a line A-A' of FIG. 3, illustrating a portion in which the curved part C1 is formed in the guide grooves 11. FIG. 4B illustrates a cross-sectional configuration taken along a line B-B' of FIG. 3, illustrating a linear part of the guide grooves 11.

As illustrated in FIGS. 4A and 4B, the surface of the housing 7 is formed of a center 7a constituting a center of the cover section 1 and peripheries 7b in the vicinity of right and left ends of the cover section 1. The periphery 7b is formed lower than the center 7a with a level difference 13, since the periphery 7b is covered with the cover 9 while accommodating the connection cables 8a and 8b.

As illustrated in FIGS. 3, 4A, and 4B, the rib-shaped protrusions 12 (12a, 12b, 12c) are formed on the periphery 7b so as to be parallel to each other.

As the side walls of the guide groove 11a in which the connection cable 8a is accommodated, side surfaces of two lines of rib-shaped protrusions 12a, 12b formed so as to be opposed to each other are used. Further, as the side walls of the guide groove 11b in which the other connection cable 8b is accommodated, the side surfaces of the rib-shaped protrusions 12b and 12c are used in FIG. 4A. In FIG. 4B, as the side walls of the guide groove 11b in which the other connection cable 8b is accommodated, an inclined surface of the level difference 13 positioned between the center 7a and the periphery 7b of the housing 7 and the rib-shaped protrusion 12b are used.

Thus, in the portion of FIG. 4A in which the two connection cables 8a and 8b are placed adjacently in the curved part C1 away from the center 7a, the three rib-shaped protrusions 12a, 12b, and 12c are formed and the center rib-shaped protrusion 12b is used together with the rib-shaped protrusions 12a and 12c formed on both sides of the rib-shaped protrusion 12b as the side walls of the two guide grooves 11a and 11b. Consequently, the number of rib-shaped protrusions 12 to be formed on the housing 7 can be reduced. This also can simplify the step of forming the guide grooves 11. Further, an area of the portion in which the guide grooves 11 are formed on the periphery 7b can be reduced, which contributes to the miniaturization of the housing 7. Further, a rib structure of the rib-shaped protrusions 12a, 12b, and 12c can be formed, which enhances the strength of the housing 7. That is, the rib-shaped protrusions 12a, 12b, and 12c placed on the periphery 7 contribute to the miniaturization, an increase in strength, etc. and thus can enlarge a margin for designing the overall shape of the housing 7.

Further, a bonnet-shaped convex part is formed on the surface of the housing 7 by drawing, mainly for the purpose of enhancing the strength of the housing 7. Therefore, on the surface of the housing 7, the center 7a is set to be much higher than the periphery 7b, as illustrated in FIGS. 3, 4A, and 4B. That is, the level difference 13 is formed in a boundary between the center 7a and the periphery 7b. The inclined surface of the level difference 13 can be used as the side wall of the guide groove 11b accommodating the connection cable 8b.

Accordingly, in a portion of FIG. 4B in which the two connection cables 8a and 8b are placed along the level difference 13 that is a boundary between the center 7a and the periphery 7b adjacent to each other linearly as illustrated in FIG. 3, the inclined surface of the level difference 13 and the rib-shaped protrusion 12b formed on the periphery 7b are used as the side walls of the guide groove 11b accommodating the connection cable 8b placed on the side of the center 7b. Thus, by using the uneven parts of the rib-shaped protrusions formed on the periphery 7b, the inclined surface of the level difference, and the like as a part of the guide grooves, the number of rib-shaped protrusions to be formed on the housing can be reduced and the area of the guide groove formation part on the housing can be decreased.

In the notebook computer 100 of the present embodiment, a depth of the guide groove 11, i.e., a height h of the rib-shaped protrusion formed on the periphery 7b, and a width (i.e., an interval of two lines of rib-shaped protrusions opposed to each other) w of the guide groove 11 are set at 1.8 mm, which is slightly larger than a diameter of 1.6 mmϕ of the connection cable 8 to be accommodated, whereby the connection cable 8 is accommodated in the guide groove 11 completely. Thus, by setting the dimensions so that the connection cable 8 is accommodated completely in the guide groove 11, the arrangement position of the connection cable 8 on the housing 7 can be regulated more reliably. Particularly, as illustrated in FIGS. 4A and 4B, the connection cables 8a and 8b can be confined respectively in the guide grooves 11a and 11b reliably by covering the tops of the guide grooves 11a and 11b with the cover 9. This can prevent the connection cable 8 from moving in the guide groove 11 more reliably, in cooperation with the curved parts C1 and C2 provided in the guide groove 11 described with reference to FIG. 3.

When the margin of the value of the width w of the guide groove 11 with respect to the thickness of the connection cable 8 is too small, it becomes difficult to insert the connection cable 8 in the guide groove 11. On the other hand, when the width w of the guide groove 11 is too large, the position of the connection cable 8 changes in the guide groove 11, which may degrade the effect of regulating the position of the connection cable 8 by providing the guide groove 11. Thus, the margin is desirably determined appropriately considering the relationship between the thickness of a wire rod to be used as the connection cable 8 and the softness of the surface material. As an example of the margin, in the case of using the above-mentioned coaxial cable as the connection cable 8, the margin can be set to be +8 to 15% with respect to the diameter of the connection cable 8.

In FIGS. 4A and 4B used for the above description, in order to prevent the figures from becoming complicated, the configuration of the liquid crystal panel 3, the configuration of portions other than the portion where the connection cables 8 are placed on the housing 7, etc. are simplified without the details being shown, and the internal structure of the housing 7 containing the liquid crystal panel 3 may have a configuration other than that illustrated in FIGS. 4A and 4B.

Figure 5:
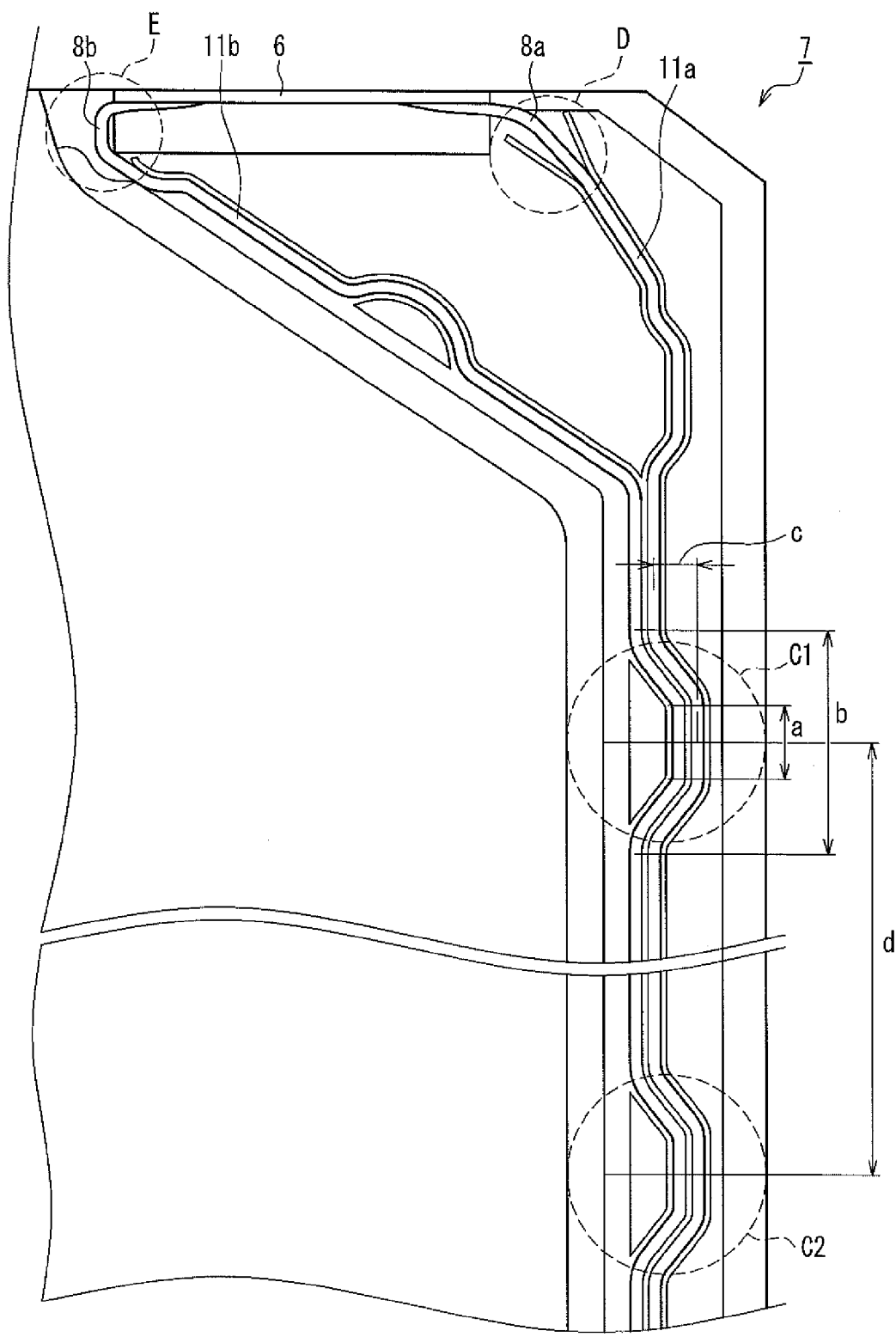
FIG. 5 is an enlarged perspective view of main portions illustrating a configuration of an antenna module arrangement part of a notebook computer.

FIG. 5 is a partially enlarged perspective view illustrating a vicinity of an end portion in which the antenna module 6 of the housing 7 is placed.

The guide groove 11a accommodating the connection cable 8a is formed so that the width of the guide groove 11a increases toward a terminal end of the guide groove 11a, as illustrated in FIG. 5 as a region D close to the arrangement position of the antenna module 6. According to this configuration, when the antenna module 6 is attached to a predetermined place in an upper end portion of the housing 7 while the connection cable 8a is attached to the substrate constituting the antenna module 6, the connection cable 8a can be accommodated easily in the guide groove 11a.

Further, the terminal end of the guide groove 11b accommodating the connection cable 8b is formed at a position slightly away from the attached part between the other end portion of the antenna module 6 and the connection cable 8b. That is, in a region indicated as an area E in FIG. 5, a portion is provided where the guide groove 11b formed of the rib-shaped protrusion 12b and the inclined surface of the level difference 13 is not present. By providing the area E, a space for inverting the direction of the connection cable 8b extended from the antenna module 6 can be realized. Thus, by providing the area E, in which the guide groove 11b is not formed, in the vicinity of a connection part between the connection cable 8b and the antenna module 6, the connection cable 8b can be accommodated in the guide groove 11b easily, when the antenna module 6 with the connection cable 8b attached thereto is attached to a predetermined place in an end portion of the housing 7.

In the portions indicated as areas D and E in FIG. 5, the degree at which the guide groove 11 directly regulates the arrangement position of the connection cable 8 is smaller, compared with that of the portion in which the side walls of the guide groove 11 are formed on both sides of the connection cable 8 with the rib-shaped protrusion 12 and/or the level difference 13. However, the connection cables 8 in the portions indicated as the areas D and E are placed close to the attachment part to the antenna module 6. Therefore, the connection cables 8 substantially are attached to the antenna module 6, and the arrangement position of the connection cables 8 are unlikely to be shifted due to vibration and shock transmitted from the outside. Therefore, in the portions indicated as the areas D and E, the ease of allowing the guide groove 11 to accommodate the connection cable 8 is given higher priority, compared with the effect of regulating the arrangement position of the connection cable 8 by the guide groove 11.

The specific dimension examples of the curved parts C1 and C2 respectively formed in the guide grooves 11a and 11b applied to the notebook computer 100 will be described with reference to FIG. 5. As described above, in the case of using the coaxial cable with a diameter of 1.6 mmϕ as the connection cables 8a and 8b, the shapes of the curved parts C1 and C2 formed respectively in the guide grooves 11a and 11b are as follows: a length a of a straight line part of the guide groove whose arrangement position is shifted in the curved part is 8 mm; a length b from a start position to an end position of the curved part is 20 mm, and a shift amount c of the guide groove in the horizontal direction is 3.5 mm. Further, an arrangement interval d between the two curved parts C1 and C2 is set to be 70 to 75 mm. According to this configuration, the arrangement position of the connection cables 8a, 8b can be prevented reliably from changing in the arrangement direction of the guide grooves 11a, 11b, and the float of the connection cables 8a, 8b caused when the connection cables 8a, 8b are accommodated in the guide grooves 11a, 11b can be prevented. The respective numerical values described above are mere examples adopted in the present embodiment in the connection cable, the guide groove, etc., and do not restrict the configuration of the notebook computer 100.

In the notebook computer 100, as the guide groove 11 regulating the arrangement position of the connection cable 8, any guide groove can be used as long as it is capable of preventing the arrangement position of the connection cable 8 from moving due to a force applied to the connection cable 8 caused by assumed shock or vibration from the outside. FIG. 3 illustrates the case where the guide groove 11 is formed completely continuously from the vicinity of the end portion of the housing 7 where the antenna module 6 is placed to the vicinity of the hinge portion 5 in the other end portion. However, in the case where the guide groove 11 cannot be formed completely continuously for some reason such as the constraint in terms of the configuration of the housing 7, the guide groove 11 appropriately can be formed intermittently within a range not causing a shift of the arrangement position of the connection cable 8.

It should be noted that, as in the guide groove 11 of the notebook computer 100 described above, by continuously forming the guide groove 11 from the vicinity of the upper end portion of the housing 7 in which the antenna module 6 is placed to the vicinity of the lower end portion with which the hinge portion 5 is engaged, and setting the depth of the guide groove 11 to be slightly larger than the diameter of the connection cable 8 over the full length, the position of the connection cable 8 can be regulated reliably over the full length. There also is another effect that the operation efficiency of the step of placing the connection cable 8 in the guide groove 11 can be enhanced. In the case of attaching the antenna module 6 to a predetermined place in an end portion of the housing 7, and after that, placing the connection cable 8 in the guide groove 11 while forming the guide groove 11 continuously and setting the depth thereof at a constant value, the connection cable 8 can be pushed in the guide groove 11 successively, for example, merely by simply sliding the finger placed on the connection cable 8 in the arrangement direction of the connection cable 8, from the antenna module 6 side to the hinge portion 5 side. In particular, even in the case where the curved parts C1 and C2, in which the arrangement direction of the connection cable 8 in the guide groove 11 changes, are formed, the connection cable 8 can be placed smoothly. Thus, the connection cable 8 can be attached to the guide groove 11 reliably, and therefore, electronic equipment having stable antenna properties can be obtained efficiently, in which the arrangement position of the connection cable is unlikely to be shifted even when shock or the like is applied from the outside.

Therefore, in the case where there is no choice but to place the guide groove 11 intermittently, it is considered that it is more preferred to provide the discontinuous part in the portion where the guide groove 11 is placed linearly, instead of providing the discontinuous part in the vicinity of the curved parts C1 and C2. Further, the reason for setting the shapes of the curved parts C1 and C2 shown in the above-mentioned embodiment to be a trapezoidal shape from a plan view, having a linear part in a middle part, is to make it easy to place the connection cable 8 in the curved parts C1 and C2. Thus, the curved parts C1 and C2 can be set optimally for the shape, arrangement interval, the number of arranged curved parts, which are set to be two in the present embodiment, in accordance with the length of the guide groove 11 in which the connection cable 8 is placed, the stiffness of the connection cable 8, etc.

As described above, in the notebook computer of the present embodiment, the connection cable placed extending from the antenna module provided in one end portion of the housing that is the cover section to the hinge portion formed in an end portion on a side different from that of the one end portion of the housing is accommodated in the guide groove. Therefore, the arrangement position of the connection cable on the surface of the housing can be prevented from changing, and noise generated due to the change in the arrangement position of the connection cable can be prevented from degrading antenna properties.

In the notebook computer of the present embodiment, as a configuration of the cover section in which the liquid crystal panel is contained, the housing is made of metal, and rib-shaped protrusions are formed to provide guide grooves accommodating connection cables on the surface on a back side opposite to the surface on which the liquid crystal panel of the housing is placed, and the connection cable arrangement part of the housing is covered with a cover made of resin. Thus, by forming the housing and the guide grooves of metal members, the connection cables accommodated in the guide grooves can be shielded from the outside. Therefore, noise can be prevented effectively from being mixed with a transmission/reception signal from the connection cables.

Further, in the case where the housing and the guide grooves are formed of metal, as illustrated in FIGS. 3 to 5, it is preferred that the connection cables 8 connected to the antenna module 6 are accommodated respectively in the separate guide grooves 11. According to this configuration, signals passing through the two connection cables 8a, 8b can be prevented from interacting with each other to cause noise between the connection cables 8a, 8b, generally, which are classified into a Hot side and a Cold side.

However, in the notebook computer of the present embodiment, the configuration of the cover section is not limited to the above, and as a material for the housing of the cover section, a resin material such as polycarbonate (PC)-based or acrylonitrile-styrene(AS)-based resin, other than metal, can be used. Further, irrespective of the material constituting the housing, the surface on which the guide grooves of the connection cables are formed also can be used as an inner side of the housing, that is, as the surface on a side where the liquid crystal panel is placed.

Further, even in the case where two connection cables extend from the antenna module, these two cables can be accommodated in one guide groove. Thus, the effect of preventing the degradation in antenna properties, which is obtained when the arrangement position of the connection cables does not change, can be exhibited. Further, as the connection cable in the present embodiment, a coaxial cable has been illustrated. However, a wire obtained by covering a wire-shaped single metal line with resin, a wire obtained by twining a thread-shaped metal wire and covering the periphery thereof with resin, etc. also can be used.

Further, in the notebook computer of the present embodiment, as a side wall of a guide groove formed on a housing, the case of using a rib-shaped protrusion formed on the housing and a level difference of the housing has been illustrated. However, a method for forming a guide groove on the surface of the housing in the present embodiment is not limited thereto. For example, in the case where a housing has a predetermined thickness, needless to say, a guide groove is obtained by dugging out the housing.

In the case where the electronic equipment according to the present invention is a notebook computer, there is no constraint on the shape of the notebook computer. Therefore, the notebook computer can have a so-called tablet form or a shape in which a hinge mechanism is provided on a side surface. Further, the display element is not limited to the liquid crystal panel illustrated above, and various display devices such as an electroluminescent (EL) panel and a plasma display panel (PDP) can be adopted as the display element.

Further, the electronic equipment according to the present invention is not limited to the notebook computer illustrated as the embodiment, and various electronic equipment having an antenna module for exchanging information wirelessly, typified by a PDA and a mobile telephone, can be adopted. In this case, needless to say, unlike the notebook computer shown in the present embodiment, the housing in which an antenna module is placed is not required to be a cover section connected rotatably with respect to a main section.

Further, in the notebook computer shown in the present embodiment, it is not essential for the connection cable connected to an antenna module to extend from the end portion of the housing on a side where the antenna module is placed to the end portion on a side opposite to the side where the antenna module is placed, with a liquid crystal panel interposed therebetween. Even in the case where the distance between the antenna module and another electric circuit is small, and the length of the connection cable is short, by accommodating the connection cable in the guide groove to regulate the arrangement position of the connection cable, the effect exhibited by the notebook computer described in the present embodiment can be exhibited, in which the antenna properties are prevented from being degraded by noise involved in a change in the arrangement position of the connection cable.

Further, the connection cable connecting the antenna module to the electronic component mounted on the circuit board is illustrated in the notebook computer disclosed in the present embodiment. However, the present invention is not limited to the antenna module, and even when a wire such as a drive cable driving a display device (e.g., a liquid crystal panel) or a power cable supplying electric power to the circuit board is used, the effect exhibited by the notebook computer disclosed in the present embodiment can be exhibited.

The electronic equipment disclosed by the present application includes an antenna module for exchanging information with an outside wirelessly, and can be used for various purposes usefully as electronic equipment that prevents antenna properties from being degraded by noise due to a change in the arrangement position of a connection cable connecting the antenna module to another electric circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic equipment, comprising: a first housing; a second housing made of metal, rotatably mounted to said first housing for movement between open and closed positions, and having a first face that faces the first housing in the closed position and a second face opposite the first face, the second face having a peripheral portion defining part of an outer surface of the second face that is recessed relative to a central portion of the second face; a display element on the first face of the second housing; a connection cable extending along the peripheral portion of the second face of the second housing and on the second face of the second housing; and a cover engaged with the second housing, made of resin and covering the peripheral portion of the second face of the second housing with a central part of the second face of the second housing exposed from the cover, the cover absorbing impact applied to the area of the peripheral portion of the second face of the second housing, wherein the first housing and second housing each comprise opposed first and second ends and opposed first and second sides, with the second housing being rotatably mounted to the first housing at the first ends of the first and second housings, an axis of rotation for the first and second housings is oriented parallel to the first ends of the first and second housings, and said peripheral portion of the second face of the second housing and said cover extend at least along the first side of the second housing between the first and second ends of the second housing; wherein the cover covers junctions of the first side of the second housing with the first and second ends of the second housing.

2. The electronic equipment according to claim 1, wherein the cover is made of a thermoplastic elastomer.

3. The electronic equipment according to claim 1, wherein the cover is a single piece.

4. The electronic equipment according to claim 1, wherein the connection cable comprises a resin outer coating, and the electronic equipment further comprises a second cover for a recessed peripheral portion on the second side of the second face of the second housing.

5. The electronic equipment according to claim 1, further comprising an antenna module on the outer surface of the second face at the second end of the second housing, wherein the connection cable is connected to the antenna module.

6. The electronic equipment according to claim 5, wherein the cover comprises a single piece that covers both the connection cable and the antenna module.

7. The electronic equipment according to claim 1, wherein the cover extends along the full length of the first side of the second housing, and the electronic equipment further comprises a second cover that extends along the full length of the second side on the second face of the second housing.

8. The electronic equipment according to claim 1, wherein the metal of the outer surface of the second housing at the peripheral portion comprises a rib that accommodates the connection cable.

9. The electronic equipment according to claim 8, wherein a guide groove accommodating the connection cable and regulating an arrangement position of the connection cable is formed on the housing.

10. The electronic equipment according to claim 9, wherein the guide groove is formed on a surface of the housing with two lines of rib-shaped protrusions formed in parallel to each other as side walls.

11. The electronic equipment according to claim 9, wherein the guide groove has a depth capable of accommodating the connection cable completely.

12. The electronic equipment according to claim 9, wherein an antenna module is provided on the outer surface of the second face at the second end of the second housing, at least two connection cables are connected to the antenna module, and the connection cables respectively are accommodated in separate guide grooves.

13. The electronic equipment according to claim 9, wherein the guide groove has a curved part whose arrangement direction on the housing is curved.

14. The electronic equipment according to claim 9, wherein an antenna module is provided on the outer surface of the second face at the second end of the second housing, the connection cable is connected to the antenna module, and the guide groove is formed with the same depth continuously from the end portion in which the antenna module is placed to an end portion positioned on a side opposite to the end portion in which the antenna module is placed.

15. The electronic equipment according to claim 9, wherein the first housing is a computer main body equipped with a keyboard.

16. The electronic equipment according to claim 1, wherein a width of the peripheral area expands in the area of the second end of the second housing.

* * * * *